United States Patent
Ali

(10) Patent No.: US 11,984,657 B2
(45) Date of Patent: May 14, 2024

(54) SMART CARD WITH RADIO FREQUENCY ANTENNAS

(71) Applicant: IDEMIA The Netherlands B.V., Haarlem (NL)

(72) Inventor: Ahmed Ali, Haarlem (NL)

(*) Notice: Subject to any disclaimer, the term of this patent is extended or adjusted under 35 U.S.C. 154(b) by 239 days.

(21) Appl. No.: 17/675,031

(22) Filed: Feb. 18, 2022

(65) Prior Publication Data

US 2023/0198140 A1    Jun. 22, 2023

(30) Foreign Application Priority Data

Dec. 17, 2021 (FR) ...................................... 2113850

(51) Int. Cl.
| | | |
|---|---|---|
| *G06K 19/077* | (2006.01) | |
| *H01L 21/48* | (2006.01) | |
| *H01L 23/13* | (2006.01) | |
| *H01L 23/498* | (2006.01) | |
| *H01L 23/66* | (2006.01) | |
| *H01Q 1/52* | (2006.01) | |
| *H04B 5/22* | (2024.01) | |

(52) U.S. Cl.
CPC ....... *H01Q 1/526* (2013.01); *G06K 19/07773* (2013.01); *H01L 21/4846* (2013.01); *H01L 23/13* (2013.01); *H01L 23/49838* (2013.01); *H01L 23/49855* (2013.01); *H01L 23/66* (2013.01); *H04B 5/22* (2024.01); *H01L 2223/6677* (2013.01)

(58) Field of Classification Search
CPC ................. H01L 21/4846; H01L 23/13; H01L 23/49838; H01L 23/66; H01L 23/49855; H01Q 1/526; H04B 5/0012; G06K 19/07773; G06K 19/067; G06K 19/07
USPC .......................... 235/492, 487, 380, 375, 493
See application file for complete search history.

(56) References Cited

U.S. PATENT DOCUMENTS

| | | | |
|---|---|---|---|
| 11,797,817 B2 * | 10/2023 | Ng | .................... G06K 19/07715 |
| 2014/0209691 A1 | 7/2014 | Finn et al. | |
| 2015/0269477 A1 | 9/2015 | Finn et al. | |
| 2016/0292669 A1 * | 10/2016 | Tunnell | .................... H01Q 1/38 |
| 2021/0081748 A1 | 3/2021 | Finn | |

FOREIGN PATENT DOCUMENTS

| | | | | |
|---|---|---|---|---|
| KR | 20200145883 A | * | 12/2020 | ....... G06K 19/07766 |
| WO | WO-2019118505 A1 | * | 6/2019 | ............. B32B 15/08 |
| WO | WO-2020197078 A1 | * | 10/2020 | ............... B23C 3/13 |

\* cited by examiner

*Primary Examiner* — Edwyn Labaze
(74) *Attorney, Agent, or Firm* — Cabinet Beau de Lomenie; Jonathan Bingham; Brian Gordaychik

(57) ABSTRACT

A smart card including a card body having a metal layer including a recess area which opens onto a peripheral edge of the metal layer, an RF chip, a first RF antenna connected to the RF chip and disposed in or facing the recess area, and a second RF antenna electrically insulated from the metal layer and from the first RF antenna. The second RF antenna includes a first antenna part extending facing the metal layer to collect an image current induced by first eddy currents flowing in the metal layer, and a second antenna part electrically connected to the first antenna part and extending facing the recess area to allow a magnetic coupling between the first RF antenna and the second RF antenna.

11 Claims, 5 Drawing Sheets

[Fig. 1]
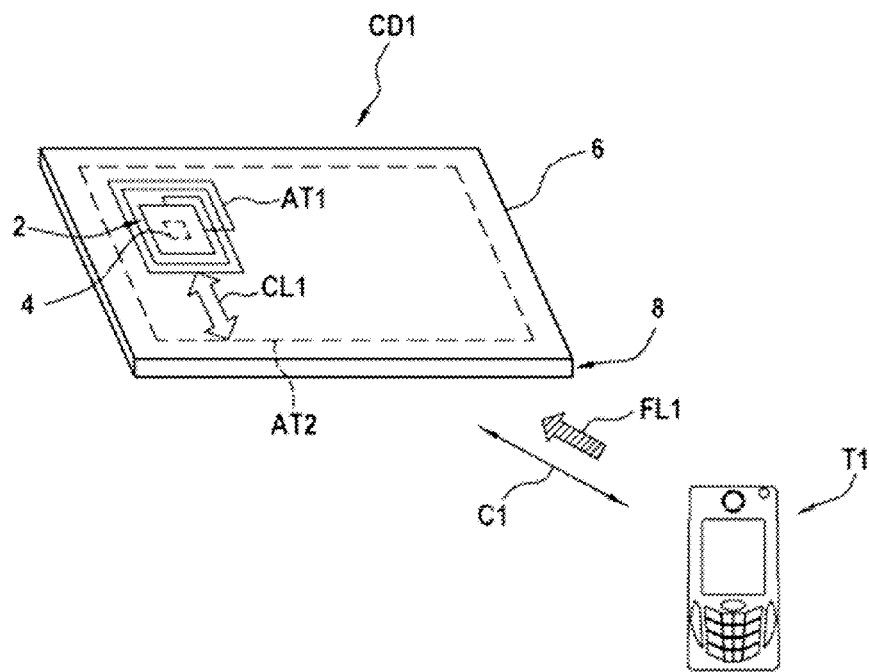
[Fig. 2]
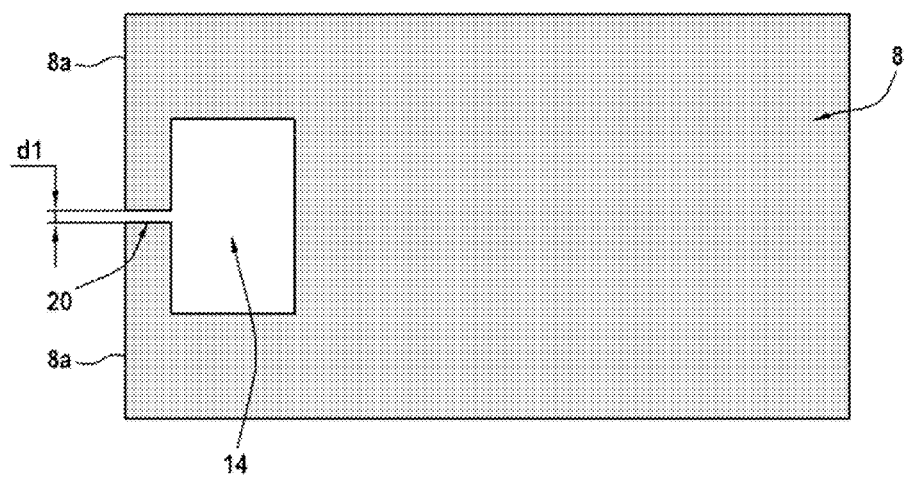

[Fig. 3]
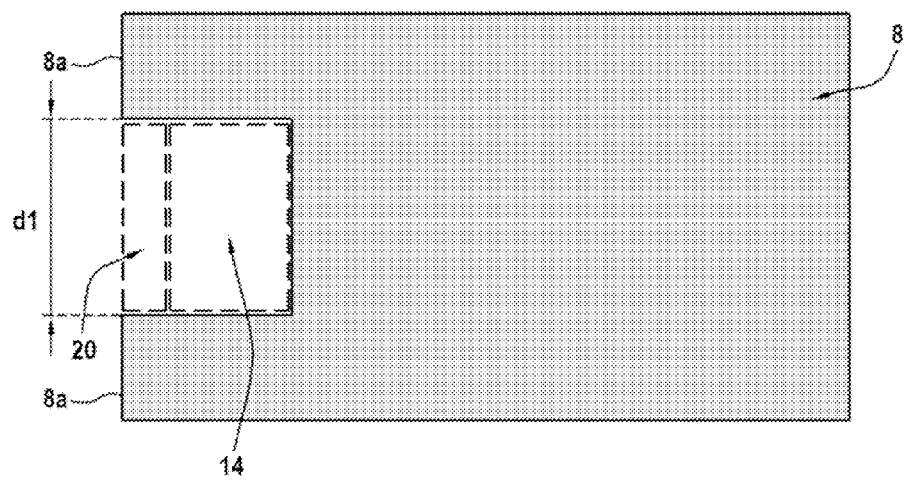
[Fig. 4]
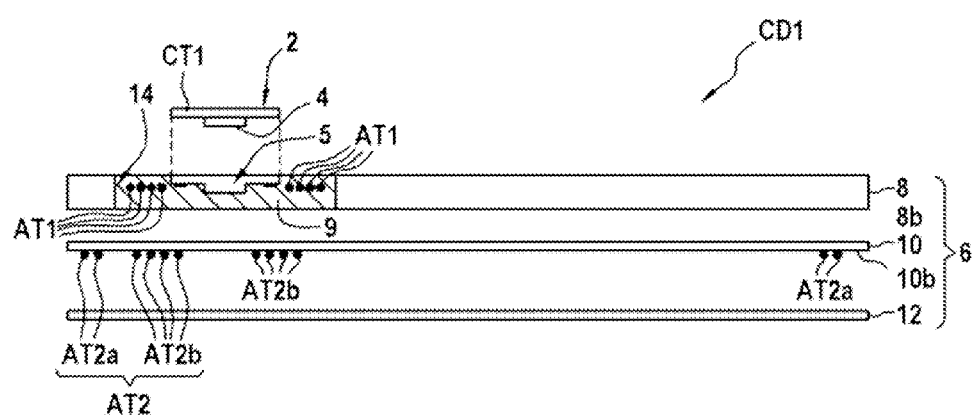

[Fig. 5]
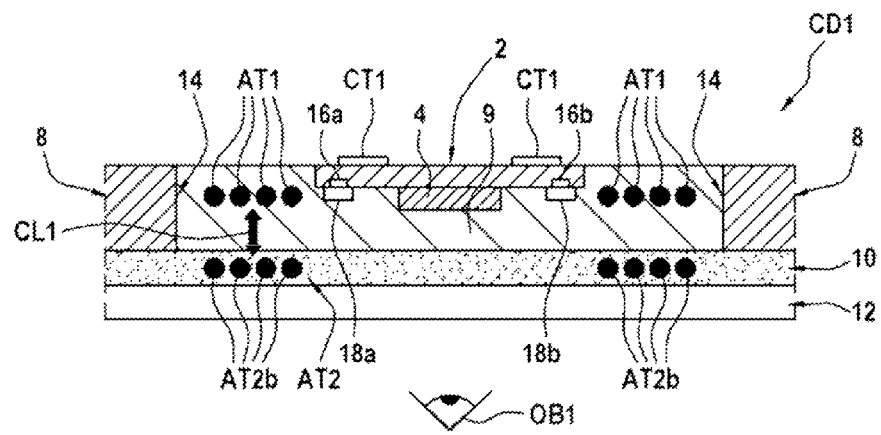
[Fig. 6]
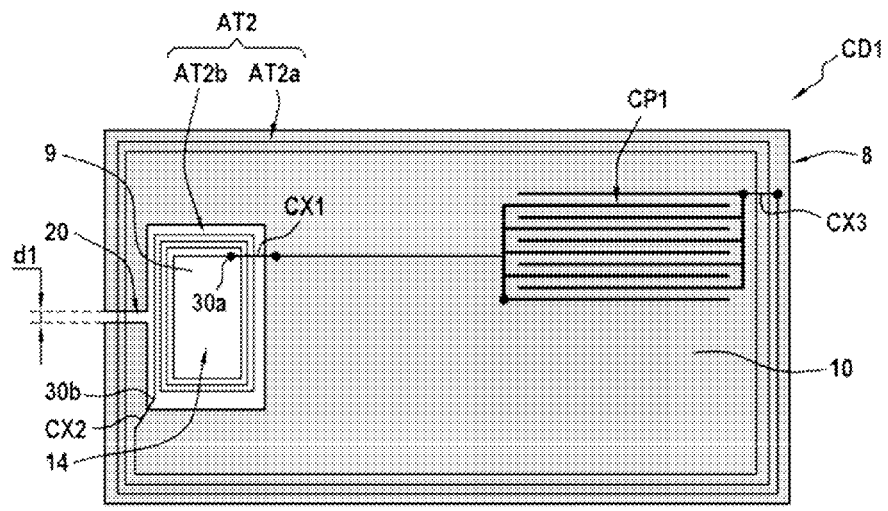

[Fig. 7]
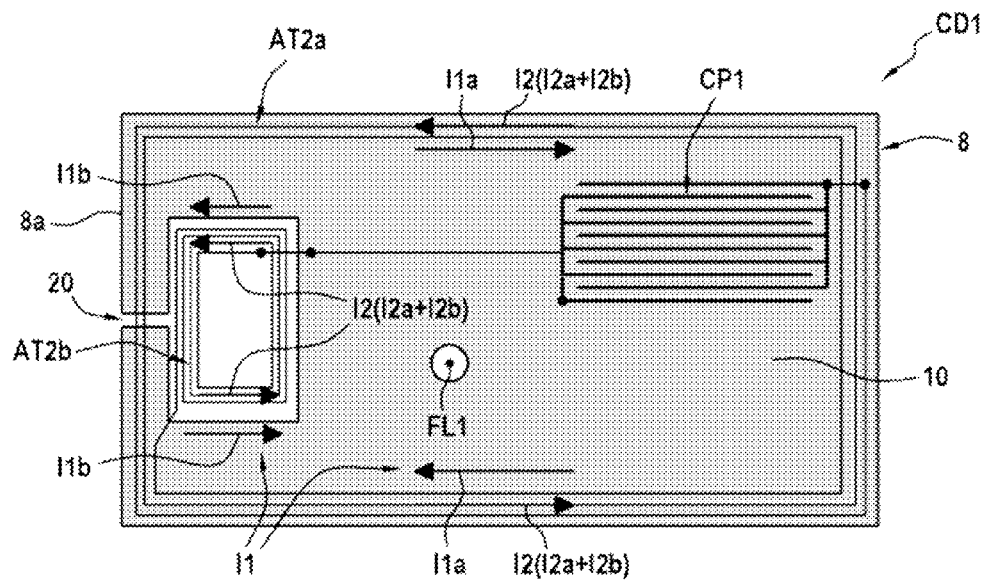
[Fig. 8]
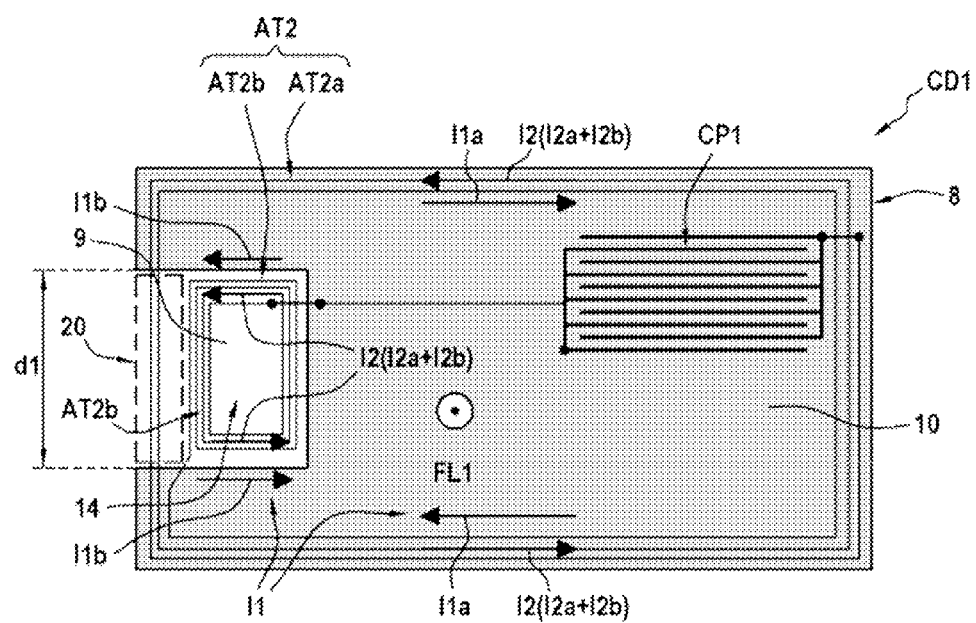

[Fig. 9]
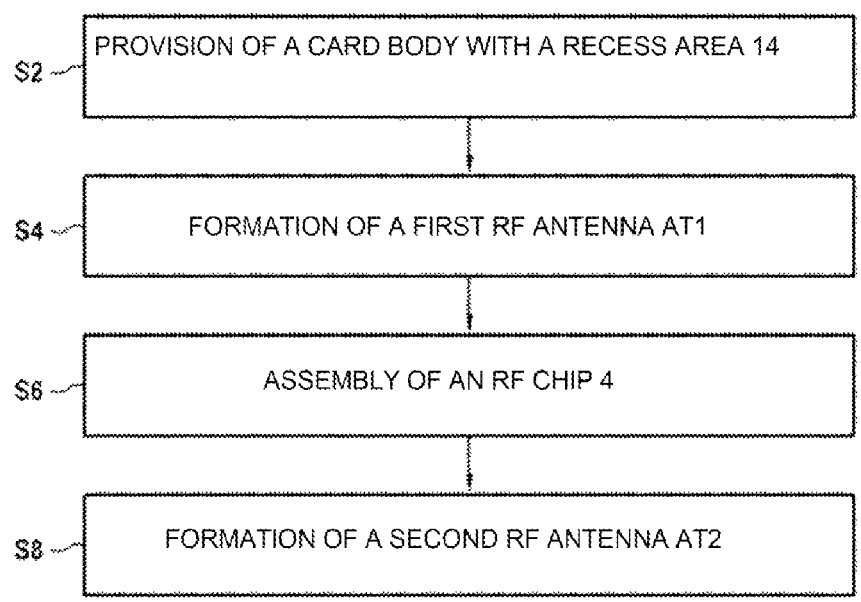

SMART CARD WITH RADIO FREQUENCY ANTENNAS

FIELD

The disclosure relates to the field of smart cards and relates more particularly to metal smart cards able to operate in contactless mode.

BACKGROUND

The use of smart cards (or microcircuit cards) is now widespread in everyday life. Such cards are for example used as bank cards, loyalty cards, access cards, etc., and can take various formats depending on their respective uses. Smart cards can be designed to perform various types of functions, in particular to carry out transactions, such as bank transactions (payment, transfer transaction, etc.), authentication transactions, etc.

In known manner, a smart card generally comprises a card body which is equipped with an electronic chip configured to exchange signals with the outside and perform various functions depending on the desired use of the card. To do so, the smart cards are provided with communication means for interacting with the outside, typically with a terminal or an external drive.

Conventionally, a smart card is designed to cooperate with an external terminal by means of external contacts accessible on the surface of the card. An external terminal can thus position appropriate contact pins on the external contacts of the card in order to establish a contact communication.

More recently, contactless smart cards have experienced an increasing growth due to the increased speed and simplicity associated with the contactless transactions. To do so, contactless cards embed a radio frequency (RF) antenna allowing the exchange of RF signals with an external terminal (for example in NFC for Near Field Communication). This RF antenna is generally composed of a plurality of conductive turns which extend into the body of the card.

The structure and the aspect of smart cards may vary where appropriate. Metal smart cards are particularly experiencing growing interest. It has been observed that metal smart cards are more robust against mechanical stresses and are therefore less likely to break or to get damaged.

In addition, there is a growing demand for metal smart cards in particular due to the attractive aesthetic aspect of these cards (metallic sheens, brushed effect on the surface, etc.), to the impression of quality they can provide (significant weight of the metal, high-end aesthetics), or to the connotation of prestige associated with it for their users. Due in particular to their heavy weight and to the high-quality impression they give, these cards are preferred by some users to serve as a social marker and a distinguishing factor.

However, it has been observed that the presence of metal in the body of a smart card poses major difficulties when the card embeds an RF antenna to operate in a contactless manner. The metal acts as an electromagnetic shielding and blocks or interferes with the RF signals exchanged by the RF antenna with the outside. The metal present in the card body can thus disrupt the contactless communications of a smart card with an external terminal and hinder for example the conduction of a contactless transaction (payment transaction or the like).

Current solutions do not always allow ensuring effective communications of a metal smart card with an external terminal in a contactless manner, and complicate the structure and therefore the manufacture of smart cards. Thus, it is known to incorporate a ferrite layer between the RF antenna and the metal layer of the smart card, but this solution makes the manufacture of the card more complex and generally does not solve the problem in that the card is unable to communicate from one of its faces with an external terminal.

There is therefore a need for high-performance metal smart cards (of the RFID type for example) and of simple manufacture, capable of effectively cooperating in a contactless manner with an external terminal, and this regardless of the orientation of the card with respect to the external terminal.

SUMMARY

To this end, the present disclosure relates to a smart card comprising:
  a card body formed at least partly by a metal layer, said metal layer comprising a recess area opening onto a peripheral edge of the metal layer;
  an RF chip;
  a first RF antenna disposed in or facing the recess area, said first RF antenna being electrically connected to the RF chip; and
  a second RF antenna electrically insulated from the metal layer and from the first RF antenna, the second RF antenna comprising:
    a first antenna part extending facing the metal layer to collect an image current induced by first eddy currents flowing in the metal layer; and
    a second antenna part electrically connected to the first antenna part and extending facing the recess area to allow a magnetic coupling between the first RF antenna and the second RF antenna.

The disclosure thus offers a high-performance metal smart card (of the RFID type for example) and of simple manufacture, capable of effectively cooperating in a contactless manner with an external terminal, and this regardless of the orientation of the card with respect to the external terminal.

When the smart card is subjected to a magnetic field, the combined action of the image current routed from the first antenna part on the one hand, and of a current induced in the second antenna part by the magnetic field at the recess area on the other hand, allows maximizing the amount of energy collected in the second RF antenna from the magnetic field, and therefore guaranteeing a high-performance magnetic coupling between the two RF antennas, which allows delivering maximum energy to the RF chip linked to the first RF antenna.

In operation, under the effect of the magnetic field to which the smart card is subjected, the RF chip is thus capable of using the second RF antenna coupled with the first RF antenna to communicate with an external terminal (particularly to exchange RF signals in transmitting and/or in receiving mode with the terminal). When a user presents the smart card in the vicinity of the terminal, a contactless communication can thus be established between the terminal and the smart card, regardless of the orientation of the latter with respect to the terminal. Indeed, eddy currents are generated in the metal layer regardless of the orientation of the smart card relative to the terminal. Similarly, regardless of the face of the smart card which is presented in front of the terminal, the second antenna part of the second antenna is capable of collecting a current component induced by the magnetic field at the recess area.

According to one particular embodiment, said eddy currents are produced under the effect of a magnetic field to which the smart card is subjected.

According to one particular embodiment, the second RF antenna is configured so that the first antenna part extends facing a peripheral area of the metal layer.

According to one particular embodiment, the metal layer comprises a slot connecting the recess area to the peripheral edge of the metal layer.

According to one particular embodiment, the recess area extends up to the peripheral edge of the metal layer.

According to one particular embodiment, the second RF antenna is configured so that the second antenna part extends exclusively facing the recess area.

According to one particular embodiment, the first RF antenna is disposed facing the recess area so that the recess area is interposed between the first and second RF antennas to allow a magnetic coupling between said first and second antennas.

According to one particular embodiment, the second RF antenna is electrically insulated from the metal layer and from the first RF antenna by an insulating layer interposed between the second RF antenna on the one hand, and the metal layer and the recess area on the other hand.

According to one particular embodiment, the smart card further comprises an electronic module including the RF chip, said electronic module being arranged in or facing the recess area.

According to one particular embodiment, the first and second antenna parts of the second RF antenna are connected in parallel with a capacitive component.

According to one particular embodiment, the magnetic coupling allows the RF chip to establish a contactless communication with the outside of the smart card by using the second RF antenna coupled to the first RF antenna.

The disclosure also relates to a method for manufacturing the smart card as defined above and described below in particular embodiments. More specifically, the disclosure relates particularly to a method for manufacturing a smart card from a card body formed at least partly by a metal layer, said metal layer comprising a recess area opening onto a peripheral edge of the metal layer, the method comprising:
   the formation on or in the card body of a first RF antenna in or facing the recess area of the metal layer;
   the assembly of an RF chip with the card body so that the RF chip is electrically connected to the first RF antenna; and
   the formation on or in the card body of a second RF antenna so that the second RF antenna is electrically insulated from the metal layer and from the first RF antenna, the second RF antenna comprising:
      a first antenna part extending facing the metal layer to collect an image current induced by first eddy currents flowing in the metal layer; and
      a second antenna part electrically connected to the first antenna part and extending facing the recess area to allow a magnetic coupling between the first RF antenna and the second RF antenna.

It will be noted that the different embodiments mentioned in this document in relation to the smart card of the disclosure as well as the associated advantages apply analogously to the manufacturing method of the disclosure.

BRIEF DESCRIPTION OF THE DRAWINGS

Other characteristics and advantages of the present disclosure will emerge from the description given below, with reference to the appended drawings which illustrate exemplary embodiments without any limitation. On the figures:

FIG. 1 schematically represents a smart card cooperating with a terminal, according to at least one embodiment of the disclosure;

FIG. 2 is a top (or bottom) view of a metal layer constituting part of a smart card according to at least one particular embodiment;

FIG. 3 is a top (or bottom) view of a metal layer constituting part of a smart card according to at least one particular embodiment;

FIG. 4 is an exploded sectional view schematically representing the structure of a smart card according to at least one embodiment of the disclosure;

FIG. 5 is a detail sectional view of a smart card, and more particularly of a portion of the card comprising a recess area, according to at least one particular embodiment;

FIG. 6 is a bottom view schematically representing a smart card according to at least one particular embodiment;

FIG. 7 is a bottom view schematically representing the operation of a smart card according to at least one particular embodiment;

FIG. 8 is a bottom view schematically representing the operation of a smart card according to at least one particular embodiment; and FIG. 9 represents in the form of a diagram the steps of a method for manufacturing a smart card of the disclosure, according to at least one particular embodiment.

DETAILED DESCRIPTION

As indicated above, the disclosure relates to metal smart cards configured to operate in contactless mode, and also relates to the manufacture of such smart cards. A "metal smart card" refers in the present document to a smart card comprising a metal or a combination (alloy) of metals, for example in the form of a metal layer or a plurality of metal layers.

As indicated above, a contactless smart card is configured by nature to communicate in a contactless manner with the outside, more particularly with an external terminal. To this end, a contactless smart card embeds a radio frequency (RF) antenna to exchange (receive and/or emit) RF signals with an external terminal. Such a smart card can further have the ability to also operate in contact mode, by using external contacts provided for this purpose on the surface of the card: this is then referred to as "dual" cards (or cards with double communication interface), these cards being thus capable of operating in contactless mode and in contact mode.

Today, there is a strong demand among users for metal smart cards, in particular for the reasons mentioned above (aesthetic aspects, impression of quality, prestige, etc.). It is particularly desirable to produce smart cards in which the main part (or a significant part) of the card body is made of metal, or at least in which the card body includes a metal plate (or metal layer), in order to obtain a certain uniformity and quality in the visual and aesthetic aspect of the card.

However, when a contactless smart card includes a metal layer as well as an RF antenna disposed on one of the faces of the metal layer, it has been observed that this metal layer disrupts the contactless communications between the RF antenna and the outside, particularly when the metal layer is disposed between the RF antenna and the external terminal with which the smart card tries to communicate, due to the electromagnetic shielding induced by the metal layer. Thus, depending on the orientation of the card, it may or may not be possible to perform a contactless transaction between a metal smart card and an external terminal. In some cases, a transaction is possible if the smart card is presented such that the antenna is disposed on the side of the terminal (without the metal layer interposing between the two), but the RF communications are disrupted, even impossible, if the metal layer forms an electromagnetic barrier between the RF antenna of the card and the terminal (the metal plate acts as an electromagnetic barrier between the RF chip and the terminal). However, for RF communications to be carried out between a metal smart card and an external terminal, it is generally necessary for the card to comprise ferrite in order to limit the electromagnetic disturbances resulting from the metal part. Without ferrite, even with the correct orientation of a metal smart card relative to an external terminal, it is generally not possible to properly exchange RF communications between the card and the terminal, thereby making any transaction impossible (or at least difficult).

The disclosure proposes to overcome in particular the drawbacks and problems mentioned above. To do so, the disclosure relates to a smart card comprising a metal layer and a particular antenna structure comprising two RF antennas, namely a first RF antenna electrically connected to an RF chip of the card, and a second RF antenna extending partly facing the metal layer to collect an image current induced by eddy currents flowing in the metal layer. Part of the second RF antenna is further configured to allow a magnetic coupling between the first RF antenna and the second RF antenna. To do so, the metal layer comprises a recess area, the first RF antenna being positioned in or facing this recess area, and part of the second RF antenna is positioned facing the recess area to allow the establishment of the magnetic coupling between the two RF antennas. By establishing such a coupling through the recess area, the RF chip of the card can thus use the second RF antenna to communicate in a contactless manner with the outside. A slot can also be arranged in the metal layer between the recess area and a peripheral edge of said metal layer in order to facilitate the magnetic coupling between the two RF antennas.

Thus, according to particular embodiments, the disclosure provides a smart card comprising: a card body formed at least partly by a metal layer, said metal layer comprising a recess area opening onto a peripheral edge of the metal layer; an RF chip; a first RF antenna disposed in or facing the recess area, said first RF antenna being electrically connected to the RF chip; and a second RF antenna electrically insulated from the metal layer and from the first RF antenna. The second RF antenna comprises: a first antenna part extending facing the metal layer to collect an image current induced by first eddy currents flowing in the metal layer; and a second antenna part electrically connected to the first antenna part, and extending facing the recess area to allow a magnetic coupling (i.e. by magnetic induction) between the first RF antenna and the second RF antenna.

The disclosure also relates to a method for manufacturing such smart cards. Particular embodiments, as well as other aspects of the disclosure, are described in more detail below.

In the present disclosure, examples of implementations are described in relation to a "dual"-type smart card, i.e. a card with a double communication interface, having the ability to communicate both in contact mode (via external contacts) and in contactless mode (via an RF antenna structure). It will however be noted that the disclosure herein can more generally apply to any smart card configured to communicate in a contactless manner, whether or not it is also able to operate in contact mode.

In addition, it is considered in the following examples that the smart card is a bank card, such as a payment card for example. This smart card can comply with the ISO 7816 standard and can operate according to the EMV standard, although neither of these aspects are mandatory for implementation. More generally, the disclosure applies to any metal smart card configured to implement a transaction in contactless mode, including EMV cards or smart cards using another transaction standard, for example the NFC standard (according for example to ISO 14443-2, ISO 10373-6, EMV Contactless Certification). In general, the smart card of the disclosure can be configured to carry out a transaction of any type, such as bank transactions (payment, transfer, debit transactions, etc.), authentication transactions, etc.

Unless otherwise indicated, the elements common or similar to several figures bear the same reference signs and have identical or similar characteristics, so that these common or similar elements are generally not described again for the sake of simplicity.

The terms "first", "second", etc. are used in this document by arbitrary convention to allow identifying and distinguishing different elements (such as keys, devices, etc.) implemented in the embodiments described below.

Particular embodiments of a smart card CD1 of the disclosure are now described with reference to FIGS. 1-6.

As represented in FIG. 1 according to some particular embodiments, the metal smart card CD1 is configured to communicate in contactless mode with the outside, for example with an external terminal (or drive) T1. To this end, the smart card CD1 comprises an RF chip 4, a card body 6 and two RF antennas (or at least two RF antennas), namely a first RF antenna AT1 and a second RF antenna AT2. The RF chip 4 as well as the two RF antennas AT1 and AT2 are positioned on or in the card body 6.

The card body 6 is formed of at least partly (or comprises) a metal layer 8. This metal layer 8 can be made of a single metal, such as stainless steel or aluminum for example, or of an alloy of several different metals. The metal layer 8 can comprise a plurality of metal sub-layers. According to one particular example, the card body 6 and more generally the smart card CD1 is devoid of ferrite, which allows simplifying the manufacture of the card.

In the examples considered here, the card body 6 is in the format ID1 of a credit card, although other shapes are possible for implementation.

The RF chip 4 is an electronic chip configured to establish a contactless communication C1 with the external terminal T1 by using the RF antennas AT1 and AT2, as described below. To do so, the RF chip 4 is electronically connected to the first RF antenna AT1 but the second RF antenna AT2 is electrically insulated from the RF chip 4 and from the first RF antenna AT1. The antennas AT1 and AT2 are partly facing each other to allow a magnetic coupling between these two antennas and thus allow the RF chip 4 to use the second RF antenna AT2 in order to establish a contactless communication C1 with the external terminal T1, as described in more detail below.

Various implementations of the smart card CD1, in particular of the metal layer 8 and the RF antennas AT1 and AT2, are possible, as represented in FIGS. 2-8.

By way of illustration, FIGS. 2 and 3 represent only the metal layer 8 according to two different embodiments. In these two examples, the metal layer 8 comprises a recess area 14 opening onto a peripheral edge (or contour) 8a of the metal layer 8. The recess area 14 is a through aperture (or area) arranged in the metal layer 8 to allow the positioning opposite the first RF antenna AT1 with part of the second RF antenna AT2 as described below. The shape and dimensions of this recess area 14 can be adapted where appropriate. By way of example, the recess area 14 arranged in the metal layer 8 is rectangular.

More specifically, in the example represented in FIG. 2, the metal layer 8 comprises a junction aperture (or area) 20 which connects or joins the peripheral edge 8a with the recess area 14. This junction aperture 20 itself constitutes a peripheral recess area which can take for example the form of a slot. In other words, the recess area 14 emerges (or opens) onto the peripheral edge 8a via this junction aperture 20. This junction area 20 is characterized by a distance d1 separating two opposite peripheral edges of the metal layer 8, the value of this distance d1 may vary where appropriate.

Thus, according to the example represented in FIG. 3, the distance d1 of the junction area 20 separating two opposite peripheral edges of the metal layer 8 is identical to the height (or length) of the recess area 14 itself. The junction area 20 thus forms in the metal layer 8 a second recess area which extends in the continuation of the first recess area 14. The recess area 14 thus forms with the junction area 20 a notch in the metal layer 8. In other words, the recess area 14 extends in this example up to the peripheral edge 8a of the metal layer 8 (without the formation of a slot or the like being necessary).

The position of the recess area 14 in the metal layer 8 may vary where appropriate. According to the particular examples represented in FIGS. 2-3, the recess area 14 positioned in the vicinity of a peripheral edge 8a of the metal layer 8, which allows ensuring a high-performance magnetic coupling FL1 between the RF antennas AT1 and AT2, as explained in more detail below. Other implementations are however possible, in which for example the recess area 14 is positioned at the center (or substantially at the center) of the metal layer 8, it being understood that this recess area 14 is always configured to open onto (or be joined to) a peripheral edge 8a of the metal layer 8 via a junction area 20.

The advantage of forming such a recess area 14 in the metal layer 8 will appear more clearly in the following description. Particular embodiments are now considered with reference to FIGS. 4-7 in which the metal layer 8 comprises a recess area 14 according to the configuration illustrated in FIG. 2.

Particularly, FIG. 4 schematically represents an exploded sectional view of the smart card CD1 and FIG. 5 schematically represents a detail sectional view of the smart card CD1, according to at least one particular embodiment.

FIGS. 6 and 7 are bottom views schematically representing the smart card CD1 seen from its lower face, i.e. from the point of view of an observer OB1 represented in FIG. 5, so as to be able to visualize in particular the second antenna AT2. To facilitate the understanding of the figures, neither the first RF antenna AT1 nor the electronic module 2 are represented in FIGS. 6-7.

FIG. 7 more particularly illustrates the smart card CD1 in operation, as described later.

As represented in FIGS. 4-7, it is considered that the chip RF4 is comprised (or embedded) in an electronic module 2, the latter being inserted into the card body 6. The electronic module 2 is for example positioned in a cavity 5 arranged on the upper face of the card body 6. To do so, the recess area 14 comprises an electrically insulating material 9 in which the cavity 5 is arranged to accommodate the electronic module 2. Thus, the RF chip 4 is positioned in the recess area 14 (or, as a variant, facing and above the recess area 14). It should however be noted that various arrangements of the RF chip 4 are possible. Variants are in particular possible in which the RF chip 4 is not disposed in, or facing, the recess area 14.

According to one variant, the RF chip 4 (with or without the electronic module 2) is positioned on (or facing) the metal layer 8. To this end, an insulating material can be disposed between the RF chip 4 and the metal layer to ensure the electrical insulation.

According to the examples considered in FIGS. 4-7, the electronic module 2 includes on its upper face external contacts (or contact pads) CT1 configured to allow communication by contact between the RF chip 4 and an external terminal provided for this purpose (for example with the terminal T1). More particularly, the electronic module 2 can comprise a printed circuit (or PCB for Printed Circuit Board) comprising on its upper face the external contacts CT1 and on its lower face the RF chip 4. The external contacts CR1 are metal areas designed to accommodate connection pins of an external terminal. These external contacts CT1 can comply with the ISO 7816 standard, although other examples are possible. The electronic module 2 is disposed in the smart card CD1 so that its external contacts CT1 are accessible from the upper surface of the card body 6 to allow the RF chip 4 to communicate by contact with an external terminal.

As already indicated, embodiments are also possible without such external contacts CT1. In addition, the integration of the RF chip 4 into the electronic module 2 as represented in the figures is not mandatory, other arrangements of the RF chip 4 being possible without such a module.

As already indicated with reference to FIG. 1, the smart card CD1 comprises two RF antennae, denoted AT1 and AT2, which are positioned in or on the card body 8. Each of the RF antennae AT1, AT2 comprises at least one electrically conductive turn so as to allow exchanges of RF signals between the smart card CD1 and the outside.

The RF antennas AT1 and AT2 can each include, for example, of an electrically conductive track, wire or member forming one or several conductive turns. It is considered in the present case that the first and second RF antennas AT1, AT2 each comprise a plurality of conductive turns. Various manufacturing techniques (wired manufacture, manufacture by deposition, by etching) well known per se can be used to produce these RF antennas. The physical characteristics (shape/size of the intersection, length of the antenna, number of turns, material, etc.) of the RF antennas AT1 and AT2 can be adapted on a case-by-case basis in order in particular to allow wireless communications at the desired frequencies (or frequency ranges).

More specifically, as represented in FIGS. 4-7, the first RF antenna AT1 comprises a plurality of electrically conductive turns—called "first" conductive turns—disposed in the recess area 14. In this particular case, the size of the RF antenna AT1 is therefore limited insofar as its first conductive turns are contained in the recess area. As a variant, the first RF antenna AT1 can be disposed not in the recess area 14 itself but facing (above) this recess area 14.

Furthermore, the second RF antenna AT2 is electrically insulated from the metal layer 8 and from the first RF antenna AT1. This insulation can be ensured in different ways where appropriate. By way of example, it is considered that the card body 6 comprises an electrically insulating layer 10 (which can be commonly called "inlay" for inner layer). The second RF antenna AT2 is thus electrically insulated from the metal layer 8 and from the first RF antenna AT1 by this insulating layer 10 which is interposed between the second RF antenna AT2 on the one hand, and the metal layer 8 and the recess area 14 on the other hand. The insulating layer 10 is particularly at the interface between the second antenna AT2 and the insulating material 9 in which the first RF antenna AT1 extends.

Furthermore, the second RF antenna AT2 comprises two antenna parts, namely a first antenna part AT2a and a second antenna part AT2b, which are electrically connected to each other. In this particular example, this second RF antenna AT2 is formed in the insulating layer 10 or possibly on the lower face 10b of the insulating layer 10.

More specifically, the first antenna part AT2a comprises a plurality of electrically conductive turns, called "second" conductive turns, which extend facing (or opposite) the metal layer 8 to collect in particular an image current I2a induced by eddy currents I1—hereinafter called "first" eddy currents—flowing in the metal layer 8. As described below with reference to FIG. 7, eddy currents are produced under the effect of a magnetic field FL1 to which the smart card is subjected. Such a magnetic field is generated in this example (FIG. 1) by an external terminal T1 with which the smart card CD1 cooperates in contactless mode. When the smart card CD1 is exposed to the magnetic field FL1, eddy currents flow in the form of current loops (primary loops and secondary loops) on the surface of the metal layer 8 (particularly on the lower face 8a of the layer metal 8 in this example; FIG. 4). The phenomenon of the formation of eddy currents is known to those skilled in the art and will therefore not be described in detail in this document.

Various configurations of the first antenna part AT2a are possible to accomplish the collection of the aforementioned image current I2a. As illustrated in FIGS. 6-7, it is considered in this example that the first antenna part AT2a (and more specifically the second conductive turns which compose it) extends facing a peripheral area of the metal layer 8 (i.e. in the vicinity of the peripheral contour of the metal layer 8). This peripheral area encircles the recess area 14 arranged in the metal layer 8. This configuration aims to allow the first antenna part AT2a to collect maximum energy in the form of induced image current I2a by the dominant eddy current loops generated on the surface of the metal layer 8 under the effect of a magnetic field FL1 to which the smart card CD1 is subjected. In other words, thanks to this particular configuration, the first eddy currents I1. (from which the image current I2 collected in the first antenna part AT2a is produced) correspond to dominant loops of the eddy currents flowing in (or on surface of) the metal layer 8 in response to the magnetic field FL1. Other configurations of the second conductive turns of the first antenna part AT2a can however be envisaged.

Thus, according to one particular example, the first antenna part AT2a wraps (or encircles or surrounds) the second part AT2b and the first RF antenna AT1. Thus, in the case for example where the smart card CD1 has a traditional bank card format (format ID1), the first antenna part AT2a can be disposed along the peripheral contour of the metal layer 8 (as close as possible to the physical edge of the metal layer 8), while adopting this spatial wrapping configuration. The gap between the first antenna part AT2a and the peripheral edge of the metal layer 8 can be greater than or equal to a minimum gap which depends on the antenna technology used (for example, the minimum gap is set to approximately 500 μm if the first antenna part AT2a is manufactured according to a technique called PCB for Printed Card Board, or set to approximately 2 mm, or to approximately 3 mm if the first antenna part AT2a is manufactured according to a wired (wired type) technology). The maximum gap between the first antenna part AT2a and the peripheral edge of the metal layer 8 can moreover be adapted on a case-by-case basis, insofar as the first antenna part AT2a wraps the second part AT2b and the first RF antenna AT1.

According to one particular example, the card body 6 is in the format ID1 of a credit card and the first antenna part AT2a comprises second conductive turns which are also substantially in the format ID1.

Furthermore, the second antenna part AT2b comprises a plurality of electrically conductive turns, called "third" conductive turns. The second antenna part AT2b is electrically connected to the first antenna part AT2a and extends facing the recess area 14 to allow a coupling CL1 (FIG. 5) by magnetic induction (magnetic coupling) between the first RF antenna AT1 and the second RF antenna AT2.

Indeed, the metal layer 8 extends into the card body 6 so as to form an electromagnetic shielding (or electromagnetic barrier) between the two faces of the smart card DV1. Thus, the second antenna part AT2b is electromagnetically insulated by the metal layer 8 with respect to the upper face of the smart card CD1 and to the external environment located in the vicinity of this upper face. Except for the first RF antenna AT1 which can be optionally disposed in the recess area 14, this recess area 14 is devoid of electrically conductive material, which allows the second antenna part AT2b to be electromagnetically coupled with the first RF antenna AT1 through said recess area 14 (FIG. 5), without the metal layer 8 being an obstacle. This also allows a direct energy coupling from the incident magnetic field of the terminal T1 and the second antenna part AT2b, which generates a current component I2b as described below in particular with reference to FIGS. 7-8.

To establish a high-performance magnetic coupling CL1, the second antenna part AT2b may be positioned facing, at least partly, the first RF antenna AT1. In general, the second antenna part AT2b is at least aligned with or facing the recess area 14 so that the magnetic coupling CL1 can be established. However, an offset can be tolerated between the first turns of the first RF antenna AT1 and the third turns of the second antenna part AT2b insofar as the recess area 9 nevertheless allows ensuring the magnetic coupling CL1.

Once the magnetic coupling CL1 has been established between the RF antennas AT1 and AT2 under the effect of a magnetic field FL1 to which the smart card CD1 is subjected, the RF chip 4 can thus use the second RF antenna AT2, coupled to the first antenna RF AT1, to communicate in contactless mode with the outside, namely with the external terminal T1 in this example (FIG. 1). The operation of the smart card CD1 and particularly of its RF antennas is described in more detail later.

The RF chip 4 can comprise for example a microcontroller (or a processor) configured to establish a contactless communication C1 with the outside of the smart card CD1 (with the external terminal T1 in this example) by using the first and second RF antennas AT1, AT2 coupled together by magnetic induction.

In general, the first antenna part AT2a of the second RF antenna AT2 occupies a larger surface than the second antenna part AT2b since the latter is positioned facing the recess area 14.

As already indicated, the RF chip 4 is disposed in the recess area 14 in the example represented in FIGS. 4-7. According to one variant, the first RF antenna AT1 is disposed outside the recess area 14, namely facing the recess area 14 (in alignment above the latter), so that the recess area 14 is interposed between the first and second RF antennas AT1 and AT2 to allow a coupling CL1 by magnetic induction between said first and second antennas AT1 and AT2.

As represented in FIGS. 4-5, the RF chip 4 is electrically connected to the first RF antenna AT1. In the example considered here, the electrical connection is ensured via connection studs (or pads) 16a and 16b with which the electronic module 2 is equipped, these studs being connected respectively to connection studs (or pads) 18a and 18b provided for this purpose in the recess area 14 (in the insulating material 9 in this example). The connection studs 18a and 18b are in turn connected respectively to the two ends of the first RF antenna AT1. Other ways to connect the RF chip 4 with the first RF antenna AT1 can however be envisaged.

Various configurations of the second RF antenna AT2 are possible. According to one preferred embodiment, the second antenna part AT2b extends exclusively facing the recess area 14. In other words, this second antenna part AT2b, formed of a plurality of third conductive turns, is disposed facing the recess area 14 so that it does not extend facing the metal layer 8. Particularly, the second antenna part AT2b does not overlap (or does not cover) the metal layer 8 on the periphery of the recess area 14, which allows optimizing the flux of the magnetic field to which the second antenna part AT2b and the first RF antenna AT1 are subjected. Although it is not desirable for a portion of the second antenna part AT2b to extend facing the metal layer 8, a certain tolerance can be accepted in some cases.

As represented in FIGS. 1, 4 and 5, the RF chip 4 (and possibly the electronic module 2) can be aligned or centered with respect to the recess area 4. Thus, in the examples considered, the conductive turns of the first RF antenna AT1 extend in the form of a winding around the RF chip 4 in the recess area 14. This arrangement allows positioning the RF chip 4 as close as possible to the first RF antenna AT1 and thus limiting the manufacturing complexity of the smart card CD1. As already indicated, other implementations are however possible where the RF chip 4 is not positioned in or facing the recess area 14.

The RF chip 4, and more generally the electronic module 2, can be arranged in the insulating layer 9 (commonly called "inlay"). This configuration makes it easier to mount the RF chip 4 and the first RF antenna AT1 in the card body 6.

As represented in FIG. 6, the smart card CD1 can further comprise a capacitive component CP1 electrically connected to the second RF antenna AT2. In the examples considered here, the capacitive component CP1 is disposed in the insulating layer 10 or on the lower face 10b of this insulating layer 10. Once the magnetic coupling CL1 has been established, the RF antennas AT1 and AT2 are connected in parallel with the capacitive component CP1. This capacitive component CP1 thus forms with the RF antennas AT1 and AT2 an RLC circuit for adapting the resonance frequency of the second RF antenna AT2 so that it is for example equal to 13.56 MHz, which allows a communication C1 in contactless mode of the RFID type with an RFID drive T1 (for example according to the ISO 14443/ISO 10373 standard, in particular the current version ISO/IEC 10373-6:2020 or any one of the earlier versions, or any later version).

In the examples represented in FIGS. 6-7, the capacitive component CP1 is of the interdigital type and comprises two opposite sets of conductive fingers entangled with each other, other forms of capacitor being however possible (parallel plate capacitor, discrete surface-mounted capacitor, parallel wire capacitor, etc.). It should be noted that the "interdigitated" capacitance CP1 (with entanglement of conductive fingers disposed facing each other) is represented schematically in FIGS. 6-7 (and in FIG. 8 described below) and does not necessarily constitute the most suitable implementation of the capacitance CP1 in the smart card CD1. It would for example be preferred to produce the capacitance CP1 in the form of a capacitance with parallel plates on either side of the insulating layer 10 or of a discrete capacitance of the "SMC" type (for "surface-mounted component").

As represented in FIGS. 6-7, it is considered for example that a first end 30a of the second antenna part AT2b is connected via a first connection CX1 with the capacitive component CP1 and that a second end 30b of the second antenna part AT2b is connected via a second connection CX2 with a first end of the first antenna part AT2a. Furthermore, the capacitive component CP1 is connected via a third connection CX3 with a second end of the first antenna part AT2a.

The RF chip 4 is thus configured to communicate in a contactless manner by using the second RF antenna AT2 when the latter is magnetically coupled with the first RF antenna AT1. In addition, the RF chip 4 can optionally communicate in contact mode with the outside via the external contacts CT1, although variants without such external contacts are possible.

As represented in FIGS. 4-7, the card body 6 may further comprise at least one external insulating layer 12 arranged on the lower face 10b of the insulating layer 10 so as to cover and protect the second RF antenna AT2. The first and second antenna parts AT2a and AT2b are thus interposed between the internal insulating layer 10 and the external insulating layer 12 in this particular example. At least one insulating protective layer can also be arranged if needed on the upper face of the card body.

The smart card CD1 as previously described with reference to FIGS. 1-2 and 4-6 is now described in operation with reference to FIG. 7, according to at least one particular embodiment. It is always considered here that the metal layer 8 has a configuration as illustrated in FIG. 2, although variants are possible.

It is assumed that the smart card CD1 is positioned within range of (in the vicinity of) the external terminal T1 so as to be exposed to the magnetic field FL1 emanating from the terminal T1. Under the effect of the magnetic field FL1 to which the smart card CD1 is subjected, eddy currents—generally denoted I1—are generated in the metal layer 8. These eddy currents I1 flow in the form of current loops on the surface of the metal layer 8. According to a well-known physical phenomenon, eddy current dominant and secondary loops are thus generated on the surface of the metal layer 8 in response to the magnetic field FL1.

As represented in FIG. 7, I1a denotes eddy currents—called first eddy currents—corresponding to dominant loops flowing on the surface of the metal layer 8 in the vicinity of the peripheral contour of said metal layer 8. I1b denotes eddy currents—called second eddy currents—corresponding to secondary loops flowing on the surface of the metal layer 8 in the vicinity of the peripheral contour of the recess area 14. Since the eddy currents flow in closed loops, the eddy currents I1b are actually the continuity of the eddy currents I1a in the vicinity of the peripheral contour of the recess area 14. As shown in FIG. 7, the second eddy currents I1b flow, in the vicinity of the second antenna part AT2b, in a direction of rotation (or direction of flow) opposite to that of the first eddy currents I1a flowing in the vicinity of the peripheral contour of the metal layer 8. By way of example, it is considered in this example that the first and second eddy currents I1a, I1b flow respectively in the clockwise and counterclockwise directions, an inverse configuration being however possible according to the orientation of the considered magnetic field FL1. The flow of the eddy currents I1a and I1b in the opposite direction results particularly from the continuity of the eddy currents mentioned above, as well as from the presence of the recess area 14 which is linked in this example by the junction slot 20 to the peripheral contour 8a of the metal layer 8.

As explained in more detail below, the current I2 flowing in the second RF antenna AT2 is an induced current resulting from two components, namely: an image current I2a induced by the first eddy currents I1 flowing on the surface of the metal layer 8 in the vicinity of the first antenna part AT2a; and a current I2b which is induced directly in the second antenna part AT2b by the incident magnetic field FL1 through the recess area 14 (I2=I2a+I2b). The very structure of the smart card CD1 is designed to lead to this double contribution of the induced currents I2a and I2b in order to collect in the second RF antenna the highest possible overall induced current I2.

More specifically, the first antenna part AT2a extending facing the metal layer 8 collects an image current I2a induced by the first eddy currents I1a flowing on the surface of the metal layer 8 under the effect of the magnetic field FL1 (FIG. 7). These first eddy currents I1a correspond to dominant loops flowing on the surface of the metal layer 8 in the vicinity of the turns of the first antenna part AT2a. As already indicated, the first antenna part AT2a can extend facing a peripheral area (or band) of the metal layer 8 to collect a maximum energy generated by the dominant loops of the eddy currents. The first eddy currents I1a flowing in the vicinity of the first antenna part AT1a (in this example on the periphery of the metal layer 8) produce an effect which opposes the incident magnetic field FL1. The induced current I2a collected in the turns of the first antenna part AT2a constitutes itself an effect of response to the first eddy currents I1a.

Thus, the image current I2a induced by the first eddy currents I1a is routed by electrical conduction up to the second antenna part AT2b, due to the electrical continuity between the first and second antenna parts AT2a, AT2b which are connected together. The image current I2a thus flows in the turns of the second antenna part AT2b positioned facing the recess area 14. As illustrated in FIG. 7, the image current I2a flows according to the same direction of rotation (or same direction of flow) in the turns of the first antenna part AT2a and in those of the second antenna part AT2b, namely in the counterclockwise direction in this example. However, due to the presence in the metal layer 8 of the recess area 14 connected via the junction slot 20 to the peripheral edge 8a, the second eddy currents I1b (secondary loops) flow in the vicinity of the recess area 14, on the surface of the metal layer 8, according to a direction of rotation (or direction of flow) opposite to that of the first eddy currents I2a flowing on the periphery of the metal layer 8. By way of example, the second eddy currents I1b flow here in the counterclockwise direction while the first eddy currents I1a flow in the clockwise direction. Also, the second eddy currents I1b flowing on the periphery of the recess area 4 contribute to amplifying the image current I1a flowing in the turns of the second antenna part AT2b.

As already indicated, the second antenna part AT2b further collects in its turns a current I2b which is induced directly by the incident magnetic field FL1 picked up at the recess area 14 by the second antenna part AT2b. In this example, the magnetic field FL1 is directed from the upper face of the smart card CD1 towards its lower face. Also, the current component I2b induced in the second antenna part AT2b also flows in the counterclockwise direction and is therefore added to the image current I2a. Since the two current components I2a and I2b flow in the same direction (in-phase components) in the second antenna AT2, they are added to contribute together to the generation of the overall induced current I2 flowing in the second antenna AT2.

The overall current I2 flowing in the second antenna part AT2b in turn induces a magnetic field causing a magnetic coupling CL1 between the first RF antenna AT1 and the second RF antenna part AT2b, and therefore a fortiori between the first RF antenna AT1 and the second RF antenna AT2. The combined action of the image current I2a routed from the first antenna part AT2a on the one hand, and of the current I2b induced by the magnetic field FL1 at the recess area 14 in the second antenna part AT2b on the other hand, allows maximizing the amount of energy collected in the second RF antenna AT2 from the magnetic field FL1, and therefore guaranteeing a high-performance magnetic coupling CL1 between the two RF antennas AT1, AT2, which allows delivering a maximum energy to the RF chip 4 linked to the first RF antenna AT1.

In operation, under the effect of the magnetic field FL1 to which the smart card CD1 is subjected, the RF chip 4 is thus capable of using the second RF antenna AT2 coupled with the first RF antenna AT1 in order to communicate with the external terminal T1 (particularly to exchange RF signals in transmitting and/or in receiving mode with the terminal T1). When a user presents the smart card CD1 in the vicinity of the terminal T1, a contactless communication can thus be established between the terminal T1 and the smart card CD1, regardless of the orientation of the latter with respect to the terminal T1. Indeed, the eddy currents I1 (and particularly the first eddy currents I1) are generated in the metal layer 8 regardless of the orientation of the smart card CD1 relative to the terminal T1. Similarly, regardless of the face of the smart card CD1 which is presented in front of the terminal T1, the second antenna part AT2b of the second antenna AT2 is capable of collecting the current component I2b induced by the magnetic field FL1 at the recess area 14.

As already indicated, various arrangements of the smart card CD1 can be envisaged, in particular as regards the configuration of shape, dimensions, position, etc. of the recess area 14 and of the junction aperture 20 connecting the recess area 14 to the peripheral edge 8a of the metal layer 8 (FIGS. 2-7). Thus, FIG. 8 is a bottom view schematically representing the operation of a smart card CD1 according to at least one particular embodiment, when this card is subjected to a magnetic field FL1 emanating for example from an external terminal T1 (FIG. 1). In the example of FIG. 8, the metal layer 8 is configured as illustrated in FIG. 3, so that the junction area 20 forms in the metal layer 8 a second recess area which extends in the continuation of the first recess area 14. The recess area 14 thus forms with the junction area 20 a notch in the metal layer 8. In other words, the recess area 14 extends in this example up to the peripheral edge 8a of the metal layer 8 (without the formation of a slot or the like being necessary).

The description above relating to the arrangement and operation of the smart card CD1 with reference to FIGS. 1-7 applies analogously to the smart card CD1 of FIG. 8.

FIG. 9 schematically represents a method for manufacturing one of the smart cards CD1 described above, according to at least one particular embodiment. The description above of the smart card CD1 according to various embodiments with reference to FIGS. 1-8 applies analogously to the manufacturing method illustrated in FIG. 9.

During a provision step S2, a card body 6 comprising a metal layer 8 as previously described is formed (or provided). Particularly, this card body 6 is formed at least partly by a metal layer 8, this metal layer 8 comprising a recess area 14 opening onto a peripheral edge 8a of the metal layer, as already described.

During a formation step S4, a first RF antenna AT1 is formed (or assembled) on or in the card body 6 in or facing the recess area 14 of the metal layer 8, as already described.

During an assembly step S6, an RF chip 4 is assembled with the card body 6 so that the RF chip 4 is electrically connected to the first RF antenna, as previously described.

During a formation step S8, a second RF antenna AT2 is formed (or assembled) on or in the card body 6 so that the second RF antenna AT2 is electrically insulated from the metal layer 8 and from the first RF antenna AT1, as already described. Particularly, the formation step S8 is carried out such that the second RF antenna comprises:
- a first antenna part AT2a extending facing the metal layer to collect an image current I2a induced by first eddy currents I1a flowing in the metal layer; and
- a second antenna part AT2b electrically connected to the first antenna part AT2a and extending facing the recess area to allow a coupling FL1 by magnetic induction between the first RF antenna and the second RF antenna.

A person skilled in the art will understand that the embodiments and variants described above only constitute non-limiting examples of implementation of the disclosure. Particularly, the person skilled in the art will be able to envisage any adaptation or combination of the embodiments and variants described above, in order to meet a very specific need in accordance with the claims presented below.

The invention claimed is:

1. A smart card comprising:
   a card body formed at least partly by a metal layer, said metal layer comprising a recess area opening onto a peripheral edge of the metal layer;
   an RF chip;
   a first RF antenna disposed in or facing the recess area, said first RF antenna being electrically connected to the RF chip; and
   a second RF antenna electrically insulated from the metal layer and from the first RF antenna, the second RF antenna comprising:
      a first antenna part extending facing the metal layer to collect an image current induced by first eddy currents flowing in the metal layer; and
      a second antenna part electrically connected to the first antenna part and extending facing the recess area to allow a magnetic coupling between the first RF antenna and the second RF antenna,
      wherein the first antenna part and the second antenna part comprise conductive turns, wherein an induced current flows in a same direction in the conductive turns of the first antenna part and in the conductive turns of the second antenna part, and wherein the metal layer comprises a slot connecting the recess area to the peripheral edge of the metal layer.

2. The smart card according to claim 1, wherein said eddy currents are produced under the effect of a magnetic field to which the smart card is subjected.

3. The smart card according to claim 1, wherein the second RF antenna is configured so that the first antenna part extends facing a peripheral area of the metal layer.

4. The smart card according to claim 1, wherein the second RF antenna is configured so that the second antenna part extends exclusively facing the recess area.

5. The smart card according to claim 1, wherein the first RF antenna is disposed facing the recess area so that the recess area is interposed between the first and second RF antennas to allow a magnetic coupling between said first and second antennas.

6. The smart card according to claim 1, wherein the second RF antenna is electrically insulated from the metal layer and from the first RF antenna by an insulating layer interposed between the second RF antenna on the one hand, and the metal layer and the recess area on the other hand.

7. The smart card according to claim 1, wherein the smart card further comprises an electronic module including the RF chip, said electronic module being arranged in or facing the recess area.

8. The smart card according to claim 1, wherein the first and second antenna parts of the second RF antenna are connected in parallel with a capacitive component.

9. The smart card according to claim 1, wherein the magnetic coupling allows the RF chip to establish a contactless communication with the outside of the smart card by using the second RF antenna coupled to the first RF antenna.

10. The smart card according to claim 1, wherein said smart card is free of ferrite.

11. A method for manufacturing a smart card from a card body formed at least partly by a metal layer, said metal layer comprising a recess area opening onto a peripheral edge of the metal layer, the metal layer comprising a slot connecting the recess area to the peripheral edge of the metal layer, the method comprising:
   the formation on or in the card body of a first RF antenna in or facing the recess area of the metal layer;
   the assembly of an RF chip with the card body so that the RF chip is electrically connected to the first RF antenna; and
   the formation on or in the card body of a second RF antenna so that the second RF antenna is electrically insulated from the metal layer and from the first RF antenna, the second RF antenna comprising:
      a first antenna part extending facing the metal layer to collect an image current induced by first eddy currents flowing in the metal layer; and
      a second antenna part electrically connected to the first antenna part and extending facing the recess area to allow a magnetic coupling between the first RF antenna and the second RF antenna,
      wherein the first antenna part and the second antenna part comprise conductive turns, so that an induced current flows in a same direction in conductive turns of the first antenna part and in conductive turns of the second antenna part.

* * * * *